United States Patent
McKinzie

(10) Patent No.: US 10,020,828 B2
(45) Date of Patent: Jul. 10, 2018

(54) ADAPTIVE IMPEDANCE MATCHING APPARATUS, SYSTEM AND METHOD WITH IMPROVED DYNAMIC RANGE

(71) Applicant: BLACKBERRY LIMITED, Waterloo (CA)

(72) Inventor: William E. McKinzie, Fulton, MD (US)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 15/205,595

(22) Filed: Jul. 8, 2016

(65) Prior Publication Data
US 2016/0322991 A1    Nov. 3, 2016

Related U.S. Application Data

(60) Division of application No. 14/169,599, filed on Jan. 31, 2014, now Pat. No. 9,419,581, which is a
(Continued)

(51) Int. Cl.
*H04B 1/38* (2015.01)
*H04B 1/04* (2006.01)
(Continued)

(52) U.S. Cl.
CPC ........... *H04B 1/0458* (2013.01); *H01Q 1/243* (2013.01); *H01Q 1/50* (2013.01); *H03H 7/40* (2013.01); *H03H 2007/386* (2013.01)

(58) Field of Classification Search
CPC ... H04B 1/0458; H03H 7/40; H03H 2007/386
See application file for complete search history.

(56) References Cited

U.S. PATENT DOCUMENTS

| 2,745,067 A | 5/1956 | True |
| 3,117,279 A | 1/1964 | Ludvigson |
| (Continued) | | |

FOREIGN PATENT DOCUMENTS

| CN | 101640949 A | 2/2010 |
| CN | 201765685 U | 3/2011 |
| (Continued) | | |

OTHER PUBLICATIONS

Canadian Office Action, Application No. 2,821,173, dated Oct. 17, 2016.

(Continued)

*Primary Examiner* — Tuan Pham
(74) *Attorney, Agent, or Firm* — Guntin & Gust, PLC; Douglas Schnabel

(57) ABSTRACT

An embodiment of the present invention provides an apparatus, comprising' an RF matching network connected to at least one RF input port and at least one RF output port and including one or more voltage or current controlled variable reactive elements; a voltage detector connected to the at least one RF output port via a variable voltage divider to determine the voltage at the at least one RF output port and provide voltage information to a controller that controls a bias driving circuit which provides voltage or current bias to the RF matching network; a variable voltage divider connected to the voltage detector and implemented using a 10 multi-pole RF switch to select one of a plurality of different resistance ratios to improve the dynamic range of the apparatus; and wherein the RF matching network is adapted to maximize RF power transferred from the at least one RF input port to the at least one RF output port by varying the voltage or current to the voltage or current controlled variable reactive elements to maximize the RF voltage at the at least one RF output port.

20 Claims, 6 Drawing Sheets

Related U.S. Application Data continuation of application No. 12/939,110, filed on Nov. 3, 2010, now Pat. No. 8,680,934, which is a continuation of application No. 12/287,599, filed on Oct. 10, 2008, now Pat. No. 7,852,170, which is a division of application No. 11/594,309, filed on Nov. 8, 2006, now Pat. No. 7,535,312.

(51) Int. Cl.
*H03H 7/40* (2006.01)
*H01Q 1/50* (2006.01)
*H01Q 1/24* (2006.01)
*H03H 7/38* (2006.01)

(56) References Cited

U.S. PATENT DOCUMENTS

| | | |
|---|---|---|
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,742,279 A | 6/1973 | Kupsky |
| 3,749,491 A | 7/1973 | Maxfield et al. |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,970,478 A | 11/1990 | Townley et al. |
| 4,980,656 A | 12/1990 | Duffalo |
| 5,032,805 A | 7/1991 | Elmer |
| 5,136,478 A | 8/1992 | Bruder |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,215,463 A | 5/1993 | Babbitt |
| 5,216,392 A | 6/1993 | Fraser et al. |
| 5,230,091 A | 7/1993 | Vaisanen et al. |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,086 A | 10/1996 | Cygan |
| 5,561,407 A | 10/1996 | Koscica |
| 5,564,086 A | 10/1996 | Cygan |
| 5,583,359 A | 12/1996 | Ng et al. |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,926,751 A | 7/1999 | Vlahos et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,973,568 A | 10/1999 | Shapiro et al. |
| 5,982,099 A | 11/1999 | Barnes et al. |
| 5,990,766 A | 11/1999 | Zhang |
| 6,008,759 A | 12/1999 | Tangemann et al. |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,868 A | 10/2000 | Butler et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,266,528 B1 | 7/2001 | Farzaneh |
| 6,281,748 B1 | 8/2001 | Klomsdorf et al. |
| 6,281,847 B1 | 8/2001 | Lee |
| 6,309,895 B1 | 10/2001 | Jaing |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,438,360 B1 | 8/2002 | Alberth, Jr. et al. |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |

(56) References Cited

U.S. PATENT DOCUMENTS

| | | |
|---|---|---|
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,628,962 B1 | 9/2003 | Katsura et al. |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,875,655 B2 | 4/2005 | Lin |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,914,487 B1 | 7/2005 | Doyle et al. |
| 6,920,315 B1 | 7/2005 | Wilcox et al. |
| 6,922,330 B2 | 7/2005 | Nielsen |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent et al. |
| 6,964,296 B2 | 11/2005 | Memory |
| 6,965,837 B2 | 11/2005 | Vintola |
| 6,987,493 B2 | 1/2006 | Chen |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,218,186 B2 | 5/2007 | Chen et al. |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 * | 5/2009 | Kato ............ H04B 1/18 333/17.3 |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 | 5/2009 | Jang |
| 7,557,507 B2 | 7/2009 | Wu |
| 7,567,782 B2 | 7/2009 | Liu et al. |
| 7,596,357 B2 | 9/2009 | Nakamata |
| 7,633,355 B2 | 12/2009 | Matsuo |
| 7,642,879 B2 | 1/2010 | Matsuno |
| 7,655,530 B2 | 2/2010 | Hosking |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit |
| 7,728,693 B2 | 6/2010 | du Toit |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,830,320 B2 | 11/2010 | Shamblin et al. |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,940,223 B2 | 5/2011 | Dou et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,213,886 B2 | 7/2012 | Blin |
| 8,217,731 B2 | 7/2012 | McKinzie et al. |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,454,882 B2 | 6/2013 | Chan et al. |
| 8,457,569 B2 | 6/2013 | Blin |
| 8,472,888 B2 | 6/2013 | Manssen et al. |
| 8,478,344 B2 | 7/2013 | Rofougaran et al. |
| 8,543,123 B2 | 9/2013 | Moon et al. |
| 8,543,176 B1 | 9/2013 | Daniel et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie, III |
| 8,693,963 B2 | 4/2014 | du Toit et al. |
| 8,712,340 B2 | 4/2014 | Hoirup et al. |
| 8,773,019 B2 | 7/2014 | Pham et al. |
| 8,774,743 B2 | 7/2014 | Ali et al. |
| 8,787,845 B2 | 7/2014 | Manssen et al. |
| 8,803,631 B2 | 8/2014 | Greene et al. |
| 8,860,525 B2 | 10/2014 | Spears et al. |
| 8,948,889 B2 | 2/2015 | Spears et al. |
| 8,957,742 B2 | 2/2015 | Spears et al. |
| 9,026,062 B2 | 5/2015 | Greene et al. |
| 9,083,405 B2 | 7/2015 | Christoffersson et al. |
| 9,119,152 B2 | 8/2015 | Blin |
| 9,231,643 B2 | 1/2016 | Greene et al. |
| 9,374,113 B2 | 6/2016 | Manssen et al. |
| 9,473,194 B2 | 10/2016 | Domino et al. |
| 9,698,758 B2 | 7/2017 | Spears et al. |
| 9,698,858 B2 | 7/2017 | Hoirup et al. |

(56) References Cited

U.S. PATENT DOCUMENTS

| | | |
|---|---|---|
| 2002/0008672 A1 | 1/2002 | Gothard |
| 2002/0030566 A1 | 3/2002 | Bozler |
| 2002/0047154 A1 | 4/2002 | Sowlati et al. |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0137464 A1 | 7/2003 | Foti et al. |
| 2003/0142022 A1 | 7/2003 | Ollikainen |
| 2003/0184319 A1 | 10/2003 | Nishimori et al. |
| 2003/0193997 A1 | 10/2003 | Dent |
| 2003/0199286 A1 | 10/2003 | D du Toit |
| 2003/0210203 A1 | 11/2003 | Phillips et al. |
| 2003/0210206 A1 | 11/2003 | Phillips et al. |
| 2003/0216150 A1 | 11/2003 | Ueda |
| 2003/0232607 A1 | 12/2003 | Le Bars |
| 2004/0009754 A1 | 1/2004 | Smith |
| 2004/0090372 A1 | 5/2004 | Nallo |
| 2004/0100341 A1 | 5/2004 | Luetzelschwab |
| 2004/0125027 A1 | 7/2004 | Rubinshteyn et al. |
| 2004/0127178 A1 | 7/2004 | Kuffner |
| 2004/0137950 A1 | 7/2004 | Bolin |
| 2004/0202399 A1 | 10/2004 | Kochergin |
| 2004/0204027 A1 | 10/2004 | Park et al. |
| 2004/0227176 A1 | 11/2004 | York |
| 2004/0232982 A1 | 11/2004 | Ichitsubo et al. |
| 2004/0257293 A1 | 12/2004 | Friedrich |
| 2004/0263411 A1 | 12/2004 | Fabrega-Sanchez et al. |
| 2004/0264610 A1 | 12/2004 | Marro et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0145987 A1 | 7/2005 | Okuda et al. |
| 2005/0208960 A1 | 9/2005 | Hassan |
| 2005/0215204 A1 | 9/2005 | Wallace |
| 2005/0227627 A1 | 10/2005 | Cyr et al. |
| 2005/0227633 A1 | 10/2005 | Dunko |
| 2005/0259011 A1 | 11/2005 | Vance |
| 2005/0260962 A1 | 11/2005 | Nazrul et al. |
| 2005/0264455 A1 | 12/2005 | Talvitie |
| 2005/0280588 A1 | 12/2005 | Fujikawa et al. |
| 2005/0282503 A1 | 12/2005 | Onno |
| 2006/0003537 A1 | 1/2006 | Sinha |
| 2006/0009165 A1 | 1/2006 | Alles |
| 2006/0022882 A1 | 2/2006 | Gerder et al. |
| 2006/0030277 A1 | 2/2006 | Cyr et al. |
| 2006/0077082 A1 | 4/2006 | Shanks et al. |
| 2006/0099915 A1 | 5/2006 | Laroia et al. |
| 2006/0099952 A1 | 5/2006 | Prehofer et al. |
| 2006/0119511 A1 | 6/2006 | Collinson et al. |
| 2006/0148415 A1 | 7/2006 | Hamalainen et al. |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0252391 A1 | 11/2006 | Poilasne et al. |
| 2006/0281423 A1 | 12/2006 | Caimi |
| 2007/0001924 A1 | 1/2007 | Hirabayashi et al. |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0077956 A1 | 4/2007 | Julian et al. |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0091006 A1 | 4/2007 | Thober et al. |
| 2007/0093282 A1 | 4/2007 | Chang et al. |
| 2007/0109716 A1 | 5/2007 | Martin et al. |
| 2007/0111681 A1 | 5/2007 | Alberth et al. |
| 2007/0121267 A1 | 5/2007 | Kotani et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston et al. |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0210899 A1 | 9/2007 | Kato et al. |
| 2007/0222697 A1 | 9/2007 | Caimi et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 | 2/2008 | Lisac et al. |
| 2008/0055016 A1 | 3/2008 | Morris |
| 2008/0055168 A1 | 3/2008 | Massey et al. |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0111748 A1 | 5/2008 | Dunn et al. |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0174508 A1 | 7/2008 | Iwai et al. |
| 2008/0261544 A1 | 10/2008 | Blin |
| 2008/0266190 A1 | 10/2008 | Ohba et al. |
| 2008/0274706 A1 | 11/2008 | Blin |
| 2008/0280570 A1 | 11/2008 | Blin |
| 2008/0285729 A1 | 11/2008 | Glasgow et al. |
| 2008/0288028 A1 | 11/2008 | Larson et al. |
| 2008/0294718 A1 | 11/2008 | Okano |
| 2008/0300027 A1 | 12/2008 | Dou |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1* | 2/2009 | McKinzie, III ......... H03H 7/40 333/17.3 |
| 2009/0051611 A1 | 2/2009 | Shamblin et al. |
| 2009/0082017 A1 | 3/2009 | Chang et al. |
| 2009/0088093 A1 | 4/2009 | Nentwig et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0196192 A1 | 8/2009 | Lim et al. |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |

(56) References Cited

U.S. PATENT DOCUMENTS

| | | |
|---|---|---|
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0164640 A1 | 7/2010 | McKinzie |
| 2010/0164641 A1 | 7/2010 | McKinzie |
| 2010/0214189 A1 | 8/2010 | Kanazawa |
| 2010/0023474 A1 | 9/2010 | Rofougaran et al. |
| 2010/0232474 A1 | 9/2010 | Rofougaran |
| 2010/0244576 A1 | 9/2010 | Hillan et al. |
| 2010/0277363 A1 | 11/2010 | Kainulainen et al. |
| 2010/0285836 A1 | 11/2010 | Horihata et al. |
| 2010/0302106 A1 | 12/2010 | Knudsen et al. |
| 2010/0304684 A1 | 12/2010 | Duron et al. |
| 2010/0304688 A1 | 12/2010 | Knudsen et al. |
| 2011/0002080 A1 | 1/2011 | Ranta |
| 2011/0012790 A1 | 1/2011 | Badaruzzaman |
| 2011/0012792 A1 | 1/2011 | Krenz |
| 2011/0014879 A1 | 1/2011 | Alberth et al. |
| 2011/0014886 A1 | 1/2011 | Manssen |
| 2011/0019606 A1 | 1/2011 | Umeda et al. |
| 2011/0026415 A1 | 2/2011 | Kamuf et al. |
| 2011/0039504 A1 | 2/2011 | Nguyen et al. |
| 2011/0043298 A1 | 2/2011 | McKinzie |
| 2011/0043328 A1 | 2/2011 | Bassali |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1 | 5/2011 | Wakabayashi et al. |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0227666 A1 | 9/2011 | Manssen |
| 2011/0237207 A1 | 9/2011 | Bauder |
| 2011/0249760 A1 | 10/2011 | Chrisikos et al. |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0285511 A1 | 11/2011 | Maguire et al. |
| 2011/0299438 A1 | 12/2011 | Mikhemar |
| 2011/0306310 A1 | 12/2011 | Bai |
| 2011/0309980 A1 | 12/2011 | Ali et al. |
| 2012/0039189 A1 | 2/2012 | Suzuki et al. |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru |
| 2012/0094708 A1 | 4/2012 | Park |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0112970 A1 | 5/2012 | Mow et al. |
| 2012/0119843 A1 | 5/2012 | du Toit et al. |
| 2012/0119844 A1 | 5/2012 | du Toit et al. |
| 2012/0139810 A1 | 6/2012 | Faraone et al. |
| 2012/0154975 A1 | 6/2012 | Oakes |
| 2012/0214421 A1 | 8/2012 | Hoirup et al. |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene |
| 2012/0295555 A1 | 11/2012 | Greene et al. |
| 2012/0309332 A1 | 12/2012 | Liao et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0076579 A1 | 3/2013 | Zhang et al. |
| 2013/0076580 A1 | 3/2013 | Zhang et al. |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0194054 A1 | 8/2013 | Presti |
| 2013/0215846 A1 | 8/2013 | Yerrabommanahalli et al. |
| 2013/0231155 A1 | 9/2013 | Sheynman et al. |
| 2013/0265912 A1 | 10/2013 | Ikonen et al. |
| 2013/0293425 A1 | 11/2013 | Zhu et al. |
| 2013/0315285 A1 | 11/2013 | Black et al. |
| 2014/0002323 A1 | 1/2014 | Ali et al. |
| 2014/0009360 A1 | 1/2014 | Ikonen et al. |
| 2014/0162572 A1 | 6/2014 | Hirabayashi |
| 2014/0210686 A1 | 7/2014 | Ali et al. |
| 2014/0287698 A1 | 9/2014 | Ali et al. |
| 2016/0241276 A1 | 8/2016 | Zhu |
| 2016/0269055 A1 | 9/2016 | Greene et al. |
| 2016/0277129 A1 | 9/2016 | Manssen |
| 2016/0336916 A1 | 11/2016 | Du Toit et al. |
| 2016/0373146 A1 | 12/2016 | Manssen et al. |
| 2017/0085244 A1 | 3/2017 | Manssen et al. |
| 2017/0264322 A1 | 9/2017 | Greene et al. |
| 2017/0264335 A1 | 9/2017 | Hoirup et al. |
| 2017/0294712 A1 | 10/2017 | Greene |
| 2017/0294891 A1 | 10/2017 | McKinzie, III |
| 2017/0373661 A1 | 12/2017 | Manssen et al. |

FOREIGN PATENT DOCUMENTS

| | | |
|---|---|---|
| DE | 19614655 | 10/1997 |
| DE | 10258805 B4 | 3/2005 |
| DE | 102008050743 | 4/2010 |
| DE | 102009018648 A1 | 10/2010 |
| EP | 0685936 | 6/1995 |
| EP | 0909024 | 4/1999 |
| EP | EP0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| EP | 2638640 A4 | 7/2014 |
| EP | 3131157 | 2/2017 |
| JP | 03276901 | 3/1990 |
| JP | 02-077580 | 9/1991 |
| JP | 9321526 | 12/1997 |
| JP | 10209722 | 8/1998 |
| JP | 2000124066 | 4/2000 |
| JP | 2005-130441 | 5/2005 |
| KR | 100645526 | 11/2006 |
| KR | 10-0740177 | 7/2007 |
| WO | 2001/071846 | 9/2001 |
| WO | 2006/031170 | 3/2006 |
| WO | 2008/030165 | 3/2008 |
| WO | 2009/06498 | 5/2009 |
| WO | 2009/108391 A1 | 9/2009 |
| WO | 2009/155966 | 12/2009 |
| WO | 2010028521 A1 | 3/2010 |
| WO | 2010121914 A1 | 10/2010 |
| WO | 2011/044592 | 4/2011 |
| WO | 2011/084716 | 7/2011 |
| WO | 2011084716 A1 | 7/2011 |
| WO | 2011102143 A1 | 8/2011 |
| WO | 2011/133657 | 10/2011 |
| WO | 2011028453 | 10/2011 |
| WO | 2012/067622 | 5/2012 |

(56) References Cited

FOREIGN PATENT DOCUMENTS

| | | |
|---|---|---|
| WO | 2012/085932 | 6/2012 |
| WO | 2012085932 A2 | 6/2012 |

OTHER PUBLICATIONS

Extended European Search Report for 12749235.3 dated Jun. 8, 2017.
Canadian IPO, "Office Action dated Mar. 10, 2017", Mar. 10, 2017, 1-3.
EPO, "Extended European Search Report, EP16188956.3," dated Jan. 9, 2017, 1-9.
"European Search Report", 16151299.1 search report, dated 2016.
"Extended European Search Report", EP Application No. 16155235.1, dated May 3, 2016.
"Office Action Received in China Patent Application 201080045689.X", dated Mar. 4, 2016, 6 pages.
"Search Report", ROC (Taiwan) Patent Application No. 101117467, English Translation, dated Apr. 12, 2016, 1 page.
Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.
Du Toit, , "Tunable Microwave Devices With Auto Adjusting Matching Circuit", U.S. Appl. No. 13/302,617, filed Nov. 22, 2011.
Du Toit, , "Tunable Microwave Devices With Auto-Adjusting Matching Circuit", U.S. Appl. No. 13/302,649, filed Nov. 22, 2011.
Eiji, N. , "High-Frequency Circuit and Its Manufacture", Patent Abstracts of Japan, vol. 1998, No. 13, Nov. 30, 1998 & JP 10 209722 A (Seiko Epson Corp), Aug. 7, 1998.
Greene, "Method and Apparatus for Tuning a Communication Device", U.S. Appl. No. 13/108,463, filed May 16, 2011.
Greene, "Method and Apparatus for Tuning a Communication Device", U.S. Appl. No. 13/108,589, filed May 16, 2011.
Hoirup, "Method and Apparatus for Radio Antenna Frequency Tuning", U.S. Appl. No. 13/030,177, filed Feb. 18, 2011.
Huang, Libo et al., "Theoretical and experimental investigation of adaptive antenna impedance matching for multiband mobile phone applications", IEEE, Sep. 7, 2005, 13-17.
Hyun, S. , "Effects of strain on the dielectric properties of tunable dielectric SrTi03 thin films", Applied Physics Letters, vol. 79, No. 2, Jul. 9, 2001.
Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.
Katsuya, K, "Hybrid Integrated Circuit Device", Patent Abstracts of Japan, Publication No. 03-276901, Date of publication of application: Sep. 12, 1991.
Manssen, "Method and Apparatus for Managing Interference in a Communication Device", U.S. Appl. No. 61/326,206, filed Apr. 20, 2010.
Manssen, "Method and Apparatus for Tuning Antennas in a Communication Device", U.S. Appl. No. 12/941,972, filed Nov. 8, 2010.
Manssen, "Method and Apparatus for Tuning Antennas in a Communication Device", U.S. Appl. No. 13/005,122, filed Jan. 12, 2011.
McKinzie, "Adaptive Impedance Matching Module (AIMM) Control Architectures", U.S. Appl. No. 13/293,544, filed Nov. 10, 2011.
McKinzie, "Adaptive Impedance Matching Module (AIMM) Control Architectures", U.S. Appl. No. 13/293,550, filed Nov. 10, 2011.
Mckinzie, "Method and Apparatus for Adaptive Impedance Matching", U.S. Appl. No. 13/217,748, filed Aug. 25, 2011.
Mendolia "Method and Apparatus for Tuning a Communication Device", U.S. Appl. No. 13/035,417, filed Feb. 25, 2011.
Paratek Microwave, Inc., "Method and Appartus for Tuning Antennas in a Communication Device", International Application No. PCT/US11/59620; Filed Nov. 7, 2011.
Patent Cooperation Treaty, "International Search Report and Written Opinion", International Application No. PCT/US2010/046241, dated Mar. 2, 2011.
Patent Cooperation Treaty, "International Search Report and Written Opinion", International Application No. PCT/US2010/056413, dated Jul. 27, 2011.
Patent Cooperation Treaty, "International Search Report and Written Opinion", dated Nov. 16, 2011, International Application No. PCT/US/2011/038543.
Patent Cooperation Treaty, "International Search Report and Written Opinion", PCT Application No. PCT/US08/005085, dated Jul. 2, 2008.
Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).
Pervez, N.K. , "High Tunability barium strontium titanate thin films for RF circuit applications", Applied Physics Letters, vol. 85, No. 19, Nov. 8, 2004.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, Jan. 2005.
Qiao, et al., "Measurement of Antenna Load Impedance for Power Amplifiers", The Department of Electrical and Computer Engineering, University of California, San Diego, Sep. 13, 2004.
Spears, , "Methods for Tuning an Adaptive Impedance Matching Network With a Look-Up Table", U.S. Appl. No. 13/297,951, filed Nov. 16, 2011.
Stemmer, Susanne , "Low-loss tunable capacitors fabricated directly on gold bottom electrodes", Applied Physics Letters 88, 112905, Mar. 15, 2006.
Taylor, T.R. , "Impact of thermal strain on the dielectric constant of sputtered barium strontium titanate thin films", Applied Physics Letters, vol. 80, No. 11, Mar. 18, 2002.
Tombak, Ali , "Tunable Barium Strontium Titanate Thin Film Capacitors for RF and Microwave Applications", IEEE Microwave and Wireles Components Letters, vol. 12, Jan. 2002.
Xu, Hongtao , "Tunable Microwave Integrated Circuits using BST Thin Film Capacitors with Device", Integrated Ferroelectrics, Department of Electrical Engineering and Computer Engineering, University of California, 2005, Apr. 2005.
Zuo, S. , "Eigenmode Decoupling for Mimo Loop-Antenna Based on 180 Coupler", Progress in Electromagnetics Research Letters, vol. 26, Aug. 2011, 11-20.
Communication pursuant to Article 94(3) EPC issued by the European Patent Office, dated Nov. 16, 2017; European Patent Application 12177197.6.
Communication pursuant to Article 94(3) EPC, Application No. 10822849.5, dated Oct. 11, 2017, 5 pages.

* cited by examiner

US 10,020,828 B2

ADAPTIVE IMPEDANCE MATCHING APPARATUS, SYSTEM AND METHOD WITH IMPROVED DYNAMIC RANGE

CROSS REFERENCE TO RELATED PATENT APPLICATION

This application is a divisional of U.S. patent application Ser. No. 14/169,599, filed Jan. 31, 2014, which is a continuation of U.S. patent application Ser. No. 12/939,110, filed Nov. 3, 2010, now U.S. Pat. No. 8,680,934, which is a continuation of U.S. patent application Ser. No. 12/287,599 filed Oct. 10, 2008 now U.S. Pat. No. 7,852,170, which is a Divisional of U.S. patent application Ser. No. 11/594,309, filed Nov. 8, 2006 now U.S. Pat. No. 7,535,312, the disclosures of all of which are hereby incorporated by reference herein in their entirety.

BACKGROUND

The function of an adaptive impedance matching module is to adaptively maximize the RF power transfer from its input port to an arbitrary load impedance ZL that changes as a function of time.

One of the important engineering specifications of an impedance matching control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher. Thus, a strong need exists for an improved adaptive impedance matching apparatus, system and method.

SUMMARY OF THE INVENTION

An embodiment of the present invention provides an apparatus, comprising an RF matching network connected to at least one RF input port and at least one RF output port and including one or more voltage or current controlled variable reactive elements, a voltage detector connected to the at least one RF output port via a variable voltage divider to determine the voltage at the at least one~output port and provide voltage information to a controller that controls a bias driving circuit which provides bias voltage or bias current to the RF matching network, and wherein the RF matching network is adapted to maximize RF power transferred from the at least one RF input port to the at least one RF output port by varying the voltage or current to the voltage or current controlled variable' reactive elements to maximize the RF voltage at the at least one RF output port.

In an embodiment of the present invention, the voltage detector may be a diode detector and wherein the variable voltage divider connected to the voltage detector may be adapted to improve the dynamic range of the apparatus. Further, a loop controller may be associated with the variable voltage divider to make the variable voltage divider programmable and the variable voltage divider may be implemented using a multi-pole RF switch to select one of a plurality of different resistances. In an embodiment of the present invention, the variable voltage divider may be operable to allow a detector coupled to the output port to be more isolated at higher power levels and improve linearity of the module for high signal levels. Further, the RF output node may be connected to a shunt RF branch comprising a series string of capacitors and by selectively tapping into various circuit nodes along the string, a variable output voltage divider is obtained. In an embodiment of the present invention and not limited in this respect, tapping into various circuit nodes may be accomplished using a digitally controlled RF switch and the RF switch may be selected from the group consisting of: FETs, MEMS or PIN diodes.

In yet another embodiment of the present invention is provided a method of adaptive impedance matching, comprising connecting an RF matching network to at least one RF input port and at least one RF output port and including one or more voltage or current controlled variable reactive elements, using a voltage detector connected to the at least one RF output port via a variable voltage divider to determine the voltage at the at least one RF output port and providing the voltage information to a controller that controls a bias driving circuit which provides bias voltage or bias current to the RF matching network, and adapting the RF matching network to maximize RF power transferred from the at least one RF input port to the at least one RF output port by varying the voltage or current to the voltage or current controlled variable reactive elements to maximize the RF voltage at the at least one RF output port.

In still another embodiment of the present invention is provided a machine-accessible medium that provides instructions, which when accessed, cause a machine to perform operations comprising connecting an RF matching network to at least one RF input port and at least one RF output port and including one or more voltage or current controlled variable reactive elements, using a voltage detector connected to the at least one RF output port via a variable voltage. divider to determine the voltage at the at least one RF output port and providing the voltage information to a controller that controls a bias driving circuit which provides voltage or current bias to the RF matching network, and adapting the RF matching network to maximize RF power transferred from the at least one RF input port to the at least one RF output port by varying the voltage or current to the voltage or current controlled variable reactive elements to maximize the RF voltage at the at least one RF output port.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
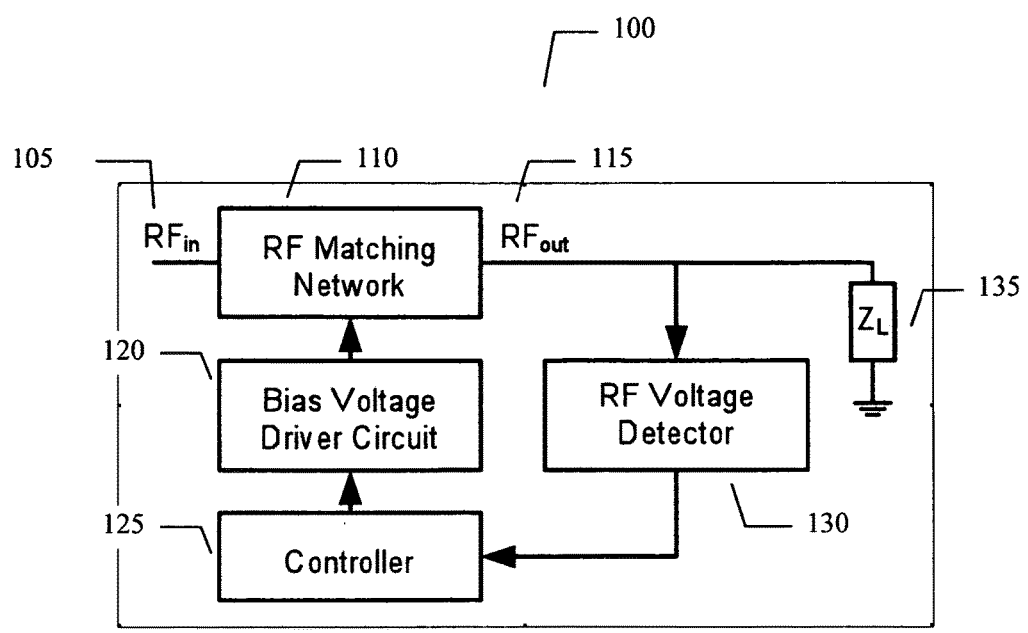
FIG. 1 illustrates a block diagram of an adaptive impedance matching module AIMM control system of one embodiment of the present invention.

In the following detailed description, numerous specific details are set .forth in order to provide a thorough understanding of the invention. However, it will be understood by those skilled in the art that the present invention may be practiced without these specific details. In other instances, well-known methods, .procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are. not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and '~connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the, present invention provides closed-loop control of an adaptive impedance matching module (AIMM). The RF output node voltage of the AIMM tuner circuit may be monitored ~d maximized to insure the best available impedance match to arbitrary load impedance. In addition, improvement in dynamic range may be achieved by adaptively changing the RF coupling level between the voltage sensed at the output port (antenna side) of the matching network and the voltage provided to the detector. This coupling level may be controlled by a processor which also does the closed loop tuning. A simple voltage divider 20 comprised of resistors and a digitally controlled RF switch may be used to realize variable coupling levels, although the present invention is not limited in this respect.' Another means of realizing variable coupling levels is to digitally switch between different tap points in a series string of variables capacitors which form a shunt voltage tunable dielectric capacitor at the output node of the AIMM tuner.

The function of an adaptive impedance matching module (AIMM) is to adaptively maximize the RF power transfer from its input port to an arbitrary load impedance ZL where the load changes as a function of time. Turning now to the figures, FIG. 1, shown generally as 100, is an AIMM block diagram.

The RF matching network 110 may contain inductors and capacitors required to transform the arbitrary load impedance $Z_L$ 135 to an impedance equal to or close to a defined system impedance, such as 50 ohms. The net benefit of this transformation is an improvement in the level of power transferred to the load $Z_L$ 135, and a reduction in the level of reflected power from the RF input port 105. This second benefit is also known as an improvement in the input mismatch loss where mismatch loss is defined as $(1-|S_{11}|^2)$.

The RF matching network 110 may contain one or more variable reactive elements which are voltage controlled. The variable reactive elements may be, although are not required to be, variable capacitances, variable inductances, or both. In general, the variable capacitors may be semiconductor varactors, MEMS varactors, MEMS switched capacitors, ferroelectric capacitors, or any other technology that implements a variable capacitance. The variable inductors may be switched inductors using various types of RF switches. including MEMS-based switches. The reactive elements may be current controlled rather than voltage controlled without departing from the spirit and scope of the present invention.

In an embodiment of the present invention, the variable capacitors of the RF matching network may be tunable integrated circuits, such as voltage tunable dielectric capacitors or Parascan Tunable Capacitors (PTCs). Each tunable capacitor may be realized as a series network of capacitors which are all tuned using a common tuning voltage.

The RF voltage detector 130 of FIG. 1 may be used to monitor the magnitude of the output nodal voltage. The fundamental concept used in this control system is that the RF power transferred to the arbitrary load impedance 135 is maximized when the RF voltage magnitude at the output port 115 is maximized. It is the understanding of this concept that allows one to remove the directional coupler conventionally located in series with the input port and to thus simplifying the architecture of the control system. A directional coupler is undesirable for numerous reasons:

(1) The cost of the coupler,
(2) The physical size of the directional coupler may be prohibitive: Broadband couplers are typically ¼ of a guide wavelength in total transmission line length at their mid-band frequency. For a 900 MHz band and an effective dielectric constant of 4, the total line length needs to be about 1.64 inches.
(3) The directivity of the directional coupler sets the lower limit on the achievable input return loss of the RF matching network. For instance, a directional coupler with 20 db of coupling will limit the input return loss for the AIMM to about −20 dB.
(4) Directional couplers have limited operational bandwidth, where the directivity meets a certain specification. In some applications, the AIMM may need to work at different frequency bands separated by an octave or more, such as at 900 MHz and 1900 MHz in a commercial mobile phone.

The RF voltage detector 130 may be comprised of a diode detector, a temperature compensated diode detector, a logarithmic amplifier, or any other means to detect an RF voltage magnitude. The phase of the RF voltage is not required. The controller 125 accepts as an input the information associated with the detected RF output 115 voltage. The controller 125 provides one or more outputs that control the bias voltage driver circuits. The controller 125 may be digitally-based such as a microprocessor, a digital signal processor, or an ASIC, or any other digital state machine. The controller may also be an analog-based system.

The bias voltage driver circuit 120 is a means of mapping control signals that are output from the controller 125 to a voltage range that is compatible with the tunable reactive elements in the RF matching network 110. The driver circuit may be an application specific integrated circuit (ASIC) whose function is to accept digital signals from the controller 125 and then output one or more analog voltages for one or more tunable reactive elements in the RF matching circuit 110. The driver circuit 120 may provide a wider range of analog tuning voltages than what is used as a power supply voltage by the controller 125. Hence the driver circuit 120 may perform the functions of voltage translation and voltage scaling.

The purpose of the control system shown in FIG. I is to monitor the output RF voltage magnitude and to use this information as an input to an algorithm that adjusts the tuning voltages provided to the tunable reactive elements in the RF matching network 110. The algorithm adjusts the reactances to maximize the RF output 115 voltage. Various options exist 20 for control algorithms. In general, the algorithm may be a scalar multi-dimensional maximization algorithm where the independent variables are the tuning voltages for the reactive elements. Some embodiments of the operation of the tuning algorithm of the present invention, may increase performance of a network and/or enable it to perform in systems that might otherwise make it difficult for the system to make all the required system specifications. GSM, EDGE and WCDMA systems have specification limiting the allowable phase shifts within a transmit burst. Additionally, all cellular handsets have SAR (specific absorption rate) limits dictating how much RF energy may be absorbed by human bodies in close proximity. There are soon to be specifications that will dictate TRP (total radiated power) to be transmitted by cellular handsets, and handset suppliers will need to meet these specifications within a small number of transmit bursts (in a TDMA system) or in a very short period of time (in a continuous transmission system).

In order to achieve the above objectives, the AIMM tuning algorithm can contain the following attributes: 1—Limit the number of tuning "steps" that are taken within a transmit burst, or limit the steps to only be allowed between bursts (when the transmitter is disabled). This can be accomplished easily by putting time delays in the algorithm, or to only allow tuning when a Tx Enable line in the transmitter is low. 2—Limit the allowed tuning to avoid certain matching impedances, or put the tuner in a "default" position when the cellular handset transmitter is at the full power step. By doing so at the highest power level, we can avoid having the handset antenna couple higher power into the human tissue near the phone's antenna. It is only at the highest power level where the SAR limit typically becomes an issue, and by limiting the effectiveness of the AIMM tuner at this power level, we can avoid the possibility of causing the handset to exceed the SAR limits.

3—In order to allow the AIMM tuner to achieve the optimal match as quickly as possible, a memory system could be engaged in which the optimal match is stored for each frequency band, or perhaps even for each group of channels, and this memorized optimal match is used as the starting position any time the phone is directed to that particular band or channel. This memory could also remember operating positions such as flip-open or flip-closed in order to better "guess" the best starting position for the matching network.

The simplified control system shown in FIG. 1 is illustrated using a 2 port RF matching network. However, this control system is extensible to multi-port RF matching networks as 'shown in FIG. 2, generally as 200. Consider a RF multiplexing filter with N input ports where each port is designed for a specific band of frequencies. Assume that N transmitters drive the N input ports 205, 210, 215 and 220, and that each input port is coupled to the single, RF output port 240 using RF circuits that contain variable reactive elements. The objective of the control system remains the same, to maximize the RF output voltage magnitude, and thus to optimize the power transfer from the nth input port to the arbitrary load impedance. Further, the RF voltage detector 245, controller 235 and bias voltage driver circuit 230 functions as described above with reference to FIG. 1 and in the embodiment of FIG. 2, the RF matching networks is a multi-port RF matching network 225.

Although the present invention is not limited in this respect, the arbitrary load impedance ZL 250 may be a multi-band antenna in a mobile wireless device and the multi-port matching network 225 may be a diplexer whose function is to route the signal between two or more paths by virtue of the signal frequency.

Figure 3:
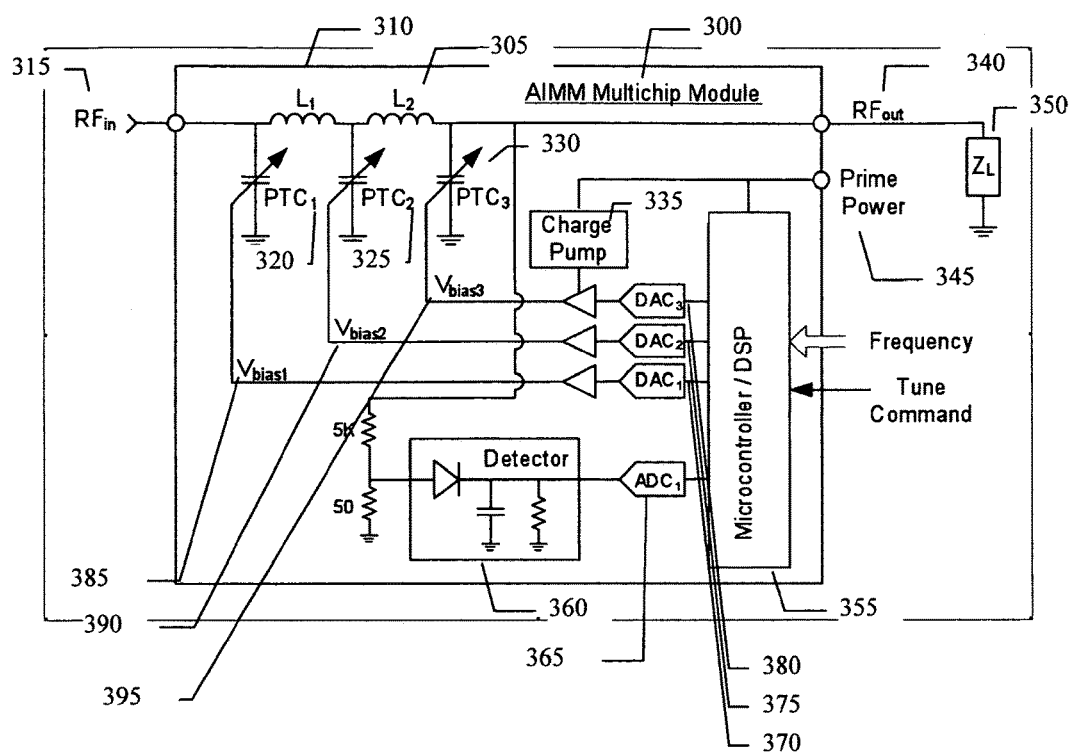
FIG. 3 shows an implementation of an AIMM closed loop control system of one embodiment of the present invention.

Looking now at FIG. 3, the variable capacitors (such as, but not limited to, PTCs) 320, 325 and 330 and inductors 305 and 310 may be built into a multi chip module 300 containing a detector 360, an ADC 365, a processor 355, DACs 370, voltage buffers, and charge pump 335. This multichip module 300 may be designed with a closed loop feedback system to maximize the RF voltage across the output node by adjusting all the PTC 320, 325 and 330 bias voltages, and doing so independently.

In an embodiment of the present invention as provided in FIG. 3, the RF matching network may be comprised of inductors $L_1$ 310, $L_2$ 305 and variable capacitors $PTC_1$ 320, $PTC_2$ 325 and $PTC_3$ 330. Note that each variable capacitor may itself be a complex network. The RF voltage detector 360 in this AIMM may be comprised of a resistive voltage divider (5 KΩ/50Ω) and the simple diode detector. In an embodiment of the present invention, the controller may be comprised of the analog-to-digital converter or $ADC_1$ 355, the microprocessor 355, plus the digital-to-analog converters $DAC_1$ 370, $DAC_2$ 375 and $DAC_3$ 380. The controller may use external signals such as knowledge of frequency, Tx or Rx mode, or other available signals in the operation of its control algorithm. The bias voltage driver circuit may be comprised of a DC-to-DC converter such as the charge pump 335, in addition to the three analog buffers whose output voltage is labeled $V_{bias1}$; 385, $V_{bias}$ 390, and $V_{bias3}$ 395. The DC-to-DC voltage converter may be needed to supply a higher bias voltage from the analog buffers than what is normally required to power the processor 355. The charge pump may supply a voltage in the range of 10 volts to 50 volts, and in some embodiments, both positive and negative supply voltages may be used.

Figure 2:
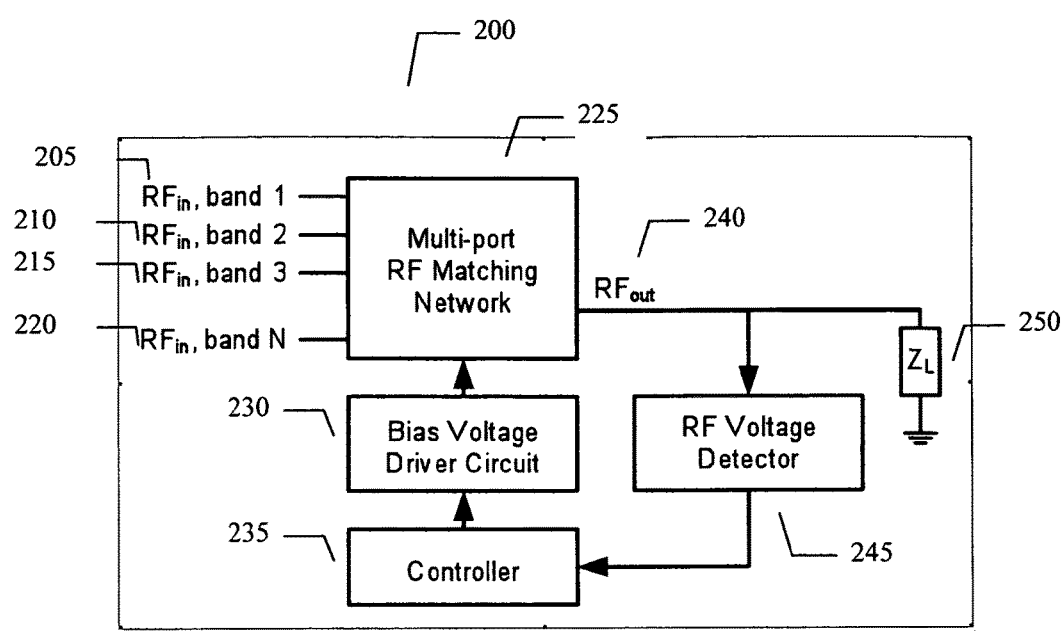
FIG. 2 illustrates a control system for a multi-port adaptive impedance matching module of one embodiment of the present invention.

It should be noted that the RF matching network shown in FIG. 2 is representative of many possible circuit topologies. Shown in FIG. 2 is a ladder network, but other topologies such as a T or Pi network may be used. The variable reactive elements (capacitors) are shown in shunt connections but that is not a restriction, as they may be used in series in other applications. Furthermore, three independent variable capacitances are shown in this RF matching network. However, fewer or more variable reactive elements may be used depending on the complexity needed to meet RF specifications.

In FIG. 3, the inductors for the RF matching network are shown to be included in the AIMM multi chip module. In practice, this may not always be the case. If the module is extremely small, it may be more convenient to use external inductors for the matching network. External inductors may have a higher Q factor than smaller inductors that are able to be integrated on the module.

Figure 4:
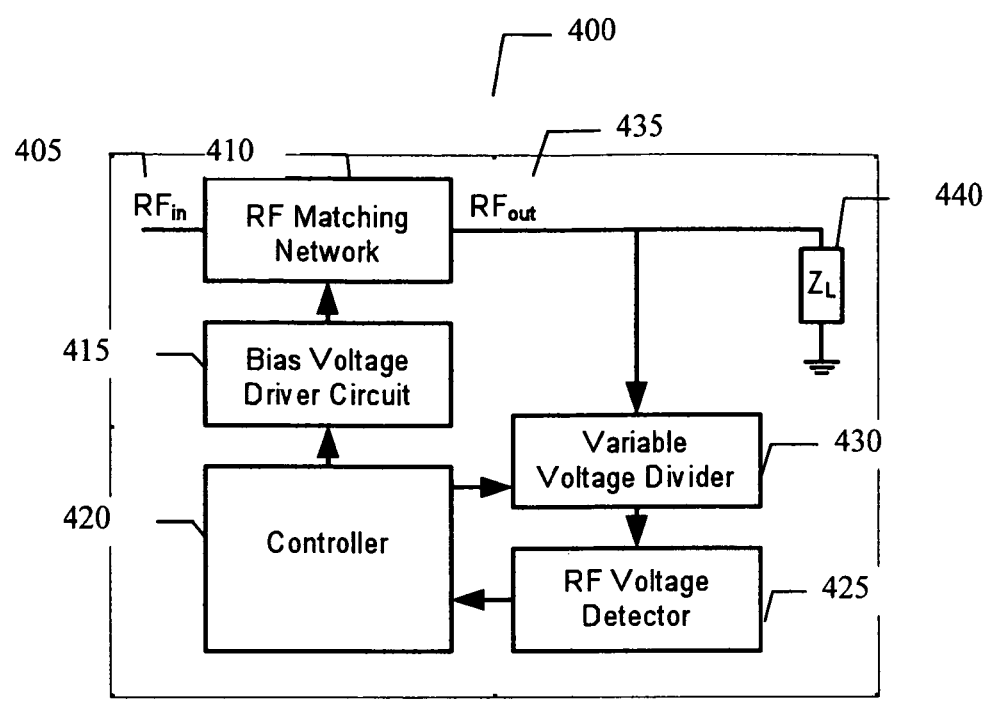
FIG. 4 is a block diagram of an adaptive impedance matching module (AIMM) with a variable voltage divider for improved dynamic range of one embodiment of the present invention.

One of the important engineering specifications of the simplified AIMM control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher. In an embodiment of the present invention, as illustrated in FIG. 4 at 400, one may use a variable voltage divider to improve the dynamic range of a simple diode detector. The variable voltage divider 430 may be added between the RF output port 435 and the RF voltage detector 425. It is controlled by the loop controller 420 (microprocessor, ASIC, etc), and therefore it is a programmable voltage divider. Bias voltage driver circuit 415 and RF matching network 410 operate as described above with respect to FIG. 1.

Figure 5:
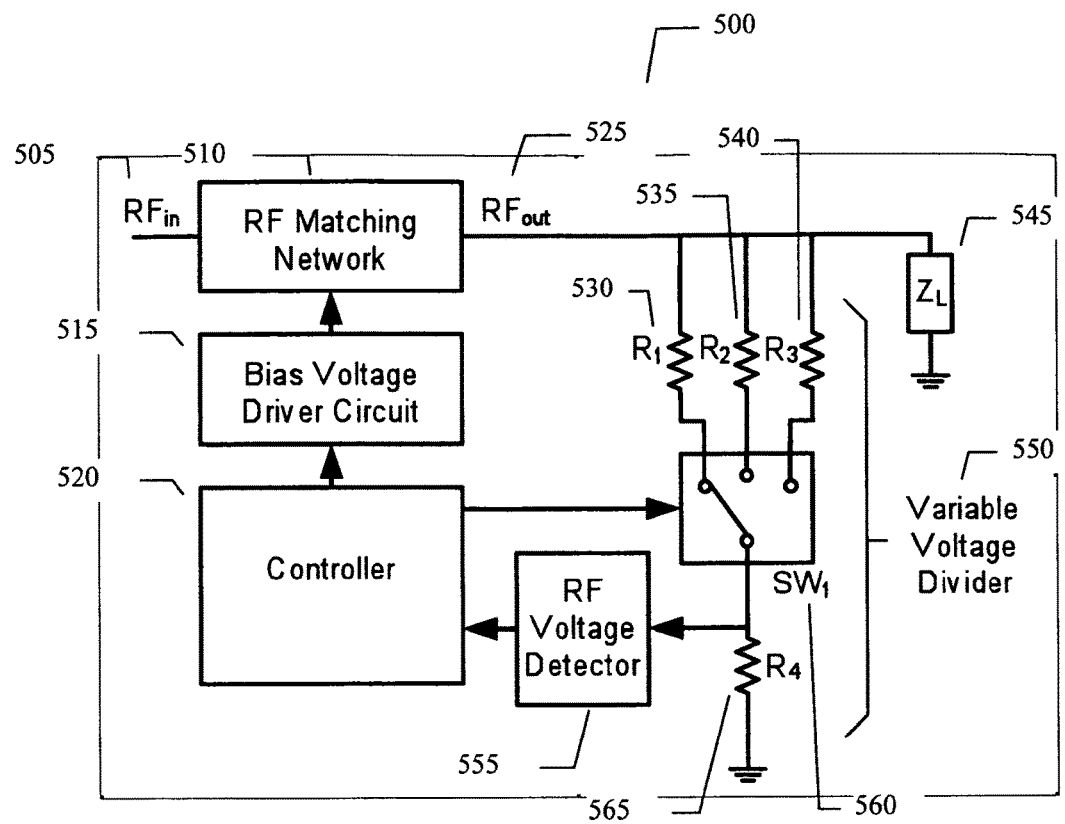
FIG. 5 illustrates an embodiment of an enhanced dynamic range AIMM control system.

As shown in FIG. 5, an embodiment of the present invention provides a simple resistive voltage divider 550 which is implemented using a three-pole RF switch 560 to select one of three different resistances: R1 530, R2 535, or R3 540. Although not limited in this respect, typical values may be 100 Ω, 1 KΩ, and 10 KΩ. A typical value for R4 565 may be 50 Ω which would be a desirable value for most RF detector designs. Assuming a high input impedance for the detector 555, the voltage coupling levels would then be I/3, I/21, and I/201.

This corresponds to voltage coupling levels of −9.5 dB, −26.4 dB, and −46 dB. At high power levels the lowest coupling is desired. At low power levels, the highest coupling level is desired. The dynamic range of the control loop is equal to that of the detector plus the difference in dB between the highest and lowest coupling levels. As an example, assume a simple diode detector is used which has about 25 dB of dynamic range. The loop dynamic range will then be 25+[−9.5−(−46)]=61.6 dB. The improvement over using no variable voltage divider is more than 36 dB.

Equally important as enhancing the dynamic range is improving the output harmonics and IP3 of the module. The variable voltage divider 550 will allow the detector input port 505 to be more isolated at the higher power levels. This will improve linearity of the module for high signal levels.

Figure 6:
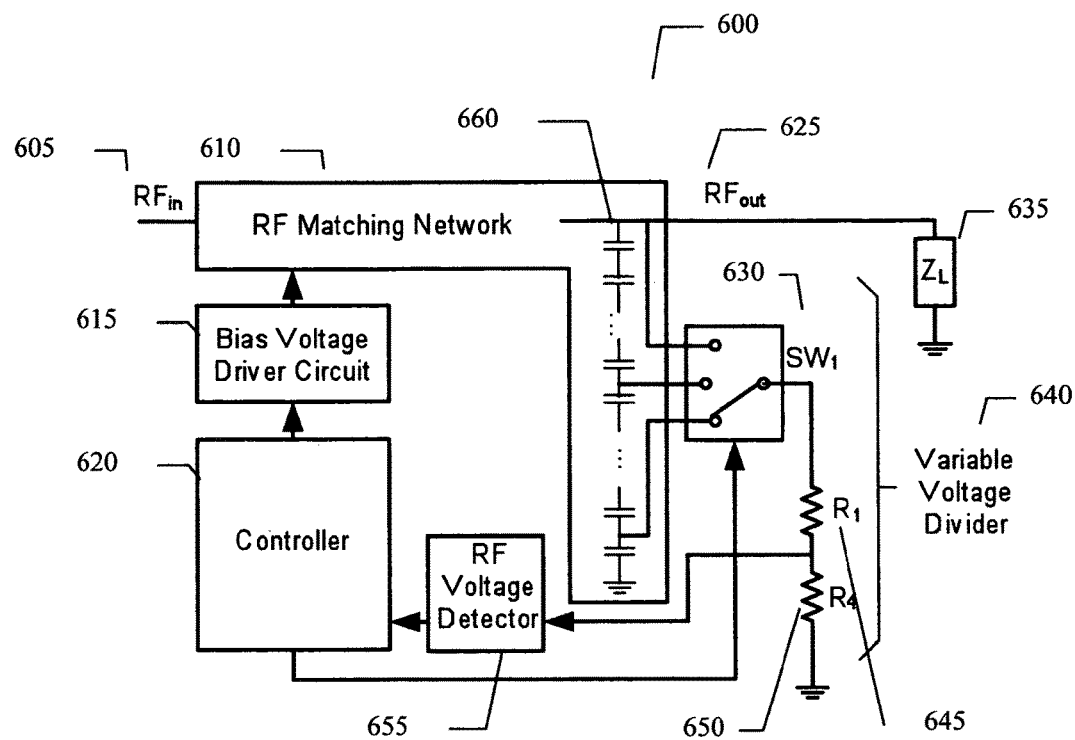
FIG. 6 shows a second embodiment of an enhanced dynamic range AIMM control system.

Turning now to FIG. 6, generally at 600 are the functional blocks of a variable 15 voltage divider 640, and the RF matching network 610 may be combined in hardware to some degree by understanding that the output node 625 of the matching network 610 may be connected to a shunt RF branch comprised of a series string of capacitors 660 and to impedance 635. An input node for $RF_{in}$ 605 may also be connected to the RF matching network 610. This series string 660 may be a RF voltage divider 640, and by selectively tapping into various circuit nodes along the string, one may obtain a variable output voltage divider 640. In an embodiment of the present invention, this is done with a digitally controlled RF switch 630. The switch 630 may be realized with FETs, MEMS, PIN diodes, or any other RF switch technology. Associated with variable voltage divider 640 is RF voltage detector 655 and controller 620, which is further connected to RF matching network 610 via bias voltage driver circuit 615.

As a practical matter, the resistance of $R_1$ 645 will need to be much higher (>10×) than the reactance of the string of series capacitors 660 between the tap point and ground. An alternative circuit to FIG. 6 would have the resistor $R_1$ 645 moved to the capacitor side of the switch $SW_1$ 630 and placed in each of the three lines going to the tap points. This will allow the resistors to be built on-hip with the tunable IC used in the matching network. Resister R4 may also be utilized at 650.

Some embodiments of the invention may be implemented, for example, using a machine-readable medium or article which may store an instruction or a set of instructions that, if executed by a machine, for example, by the system of FIG. 1 or FIG. 2, by controller 125 and 235 in communication with bias voltage driver circuit 120 and 230, by processor 355 of FIG. 3, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD- R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

An embodiment of the present invention provides a machine-accessible medium that provides instructions, which when accessed, cause a machine to perform operations comprising adapting an RF matching network to maximize RF power transferred from at least one RF input port to at least one RF output port by controlling the variation of the voltage or current to voltage or current controlled variable reactive elements in said RF matching network to maximize the RF voltage at said at least one RF output port. The machine-accessible medium of the present invention may further comprise said instructions causing said machine to perform operations further comprising receiving information from a voltage detector connected to said at least one RF output port which determines the voltage at said at least one RF output port and providing voltage information to a controller that controls a bias driving circuit which provides voltage or current bias to said RF matching network.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors r controllers, or devices as are known in the art. Some embodiments of the invention may include buffers, registers, stacks, storage Units and/or memory units, for temporary or long-term storage of data or in order to facilitate the operation of a specific embodiment.

Throughout the aforementioned description, BST may be used as a tunable dielectric material that may be used in 'a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material. This family of tunable dielectric materials may be referred to as Parascan®.

The term Parascan® as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO-MgO"; U.S. Pat. No. 5,486,491 to Sengupta, et al. entitled "Ceramic Ferroelectric Composite Material—BSTO-ZrO2"; U.S. Pat. No. 5,635,434 by Sengupta et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled 5 "Ceramic Ferroelectric Composite Materials with Enhanced Electronic Properties BSTO Mg Based Compound-Rare Earth Oxide". These patents are incorporated herein by reference. The materials shown in these patents, especially BSTO-MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)$ $5KH_2PO_2$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconates, and titanates to further reduce the dielectric loss.

In addition, the following U.S. patents and patent Applications, assigned to the assignee of this application, disclose additional examples of tunable dielectric materials: U.S. Pat. No. 6,514,895, entitled "Electronically Tunable Ceramic Materials Including Tunable Dielectric and Metal Silicate Phases"; U.S. Pat. No. 6,774,077, entitled "Electronically Tunable, Low-Loss Ceramic Materials Including a Tunable Dielectric Phase and Multiple Metal Oxide Phases"; U.S. Pat. No. 6,737,179 filed Jun. 15, 2001, entitled "Electronically Tunable. Dielectric Composite Thick Films And Methods Of Making Same; U.S. Pat. No. 6,617,062 entitled "Strain-Relieved Tunable Dielectric Thin Films"; U.S. Pat. No. 6,905,989, filed May 31, 2002, entitled "Tunable Dielectric Compositions Including Low Loss Glass"; U.S. patent application Ser. No. 10/991,924, filed Nov. 18, 2004, entitled "Tunable Low Loss Material 15 Compositions and Methods of Manufacture and Use Therefore" These patents and patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$.

The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_{3/2}SnO_2$, $Nd_2O_3$, $Pr_7O_{11}$, $Yb_2O_3$, $H_{o2}O_3$, $La_2O_3$, $MgNb_2O_6$, $SrNb_2O_6$, $BaNb_2O_6$, $MgTa_2O_6$, $BaTa_2O_6$ and $Ta_2O_3$.

Films of tunable dielectric composites may comprise Ba1-xSrxTiO3, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li_2SiO_3$ and $L_4SiO_2$. Metals from Groups 3A, 4A and some transition metals of the Periodic. Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. The above tunable materials can be tuned at room temperature by controlling an electric field that is applied across the materials.

In addition to the electronically tunable dielectric phase, the electronically tunable materials can include at least two additional metal oxide phases. The additional metal oxides 5 may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, 10 metals such as Al, Si, Sn, Pb and Bi may be used. In addition, the metal oxide phases may comprise rare earth metals such as Sc, Y, La, Ce, Pr, Nd and the like.

The additional metal. oxides may include, for example, zirconates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$ and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases are typically present in total amounts of from about 1 to about 80 weight percent of the material, preferably from about 3 to about 65 weight 20 percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to· 80 weight percent are typically used, smaller additive amounts of from 0.01 to 1 weight percent 5 may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A mobile communication device, comprising:
   an antenna;
   a matching network having an output coupled with the antenna, wherein the matching network comprises one or more variable reactive elements;
   a memory to store computer instructions; and
   a controller coupled with the memory and the matching network, wherein the controller, responsive to executing the computer instructions, performs operations comprising:
   obtaining a voltage at the output of the matching network, wherein the voltage is obtained using a voltage detector;
   determining whether to adjust the matching network according to the voltage that is obtained; and
   responsive to a determination to adjust the matching network, adapting the matching network to increase the voltage at the output of the matching network that is coupled to the antenna, wherein the adapting mitigates undesired matching impedances in the matching network by varying the one or more variable reactive elements.

2. The mobile communication device of claim 1, wherein the matching network comprises one or more variable reactive elements, and wherein the one or more variable reactive elements comprise a semiconductor varactor, a micro-electro-mechanical systems (MEMS) varactor, a MEMS switched reactive element, a semiconductor switched reactive element, a ferroelectric capacitor or a combination thereof.

3. The mobile communication device of claim 1, wherein the voltage detector is coupled to the output via a variable voltage divider.

4. The mobile communication device of claim 3, wherein the variable voltage divider is programmable using a loop controller.

5. The mobile communication device of claim 3, wherein the voltage detector is a diode detector.

6. The mobile communication device of claim 1, wherein the operations further comprise identifying a default reactance value according to an operating frequency, wherein the varying of the one or more variable reactive elements commences at the default reactance value.

7. The mobile communication device of claim 1, wherein the operations further comprise:
   identifying a physical state of the mobile communication device; and
   identifying a default reactance value according to the physical state, wherein the varying of the one or more variable reactive elements commences at the default reactance value.

8. The mobile communication device of claim 1, wherein the adapting of the matching network comprises limiting a number of tuning steps within a transmit burst.

9. A non-transitory computer-readable storage device including computer instructions which, when executed by a processor of a mobile communication device, cause the processor to perform operations comprising:
   obtaining a voltage at an output of a matching network of the mobile communication device, wherein the voltage is obtained using a voltage detector, and wherein the output of the matching network is coupled to an antenna of the mobile communication device;
   determining whether to adjust the matching network according to the voltage that is obtained; and
   responsive to a determination to adjust the matching network, adapting the matching network to increase the voltage at the output of the matching network that is coupled to the antenna, wherein the adapting mitigates undesired matching impedances in the matching network by varying one or more variable reactive elements of the matching network.

10. The non-transitory computer-readable storage device of claim 9, wherein the one or more variable reactive elements comprise a semiconductor varactor, a micro-electro-mechanical systems (MEMS) varactor, a MEMS switched reactive element, a semiconductor switched reactive element, a ferroelectric capacitor or a combination thereof.

11. The non-transitory computer-readable storage device of claim 9, wherein the voltage detector is coupled to the output via a variable voltage divider.

12. The non-transitory computer-readable storage device of claim 11, wherein the variable voltage divider is programmable using a loop controller.

13. The non-transitory computer-readable storage device of claim 9, wherein the voltage detector is a diode detector.

14. The non-transitory computer-readable storage device of claim 9, wherein the operations further comprise identifying a default reactance value according to an operating frequency, wherein the varying of the one or more variable reactive elements commences at the default reactance value.

15. The non-transitory computer-readable storage device of claim 9, wherein the operations further comprise:
   identifying a physical state of the mobile communication device; and
   identifying a default reactance value according to the physical state, wherein the varying of the one or more variable reactive elements commences at the default reactance value.

16. The non-transitory computer-readable storage device of claim 9, wherein the adapting of the matching network comprises limiting a number of tuning steps within a transmit burst.

17. A method, comprising:
   obtaining, by a processing system including a processor, a voltage at an output of a matching network that is coupled to an antenna, wherein the voltage is obtained using a voltage detector;
   determining whether to adjust the matching network according to the voltage that is obtained; and
   responsive to a determination to adjust the matching network, adapting, by the processing system, the matching network to increase the voltage at the output of the matching network that is coupled to the antenna, wherein the adapting mitigates undesired matching impedances in the matching network by varying one or more variable reactive elements of the matching network.

18. The method of claim 17, wherein the one or more variable reactive elements comprise a semiconductor varactor, a micro-electro-mechanical systems (MEMS) varactor, a MEMS switched reactive element, a semiconductor switched reactive element, a ferroelectric capacitor or a combination thereof.

19. The method of claim 17, wherein the voltage detector is coupled to the output via a variable voltage divider.

20. The method of claim 17, further comprising identifying, by a processing system, a default reactance value according to an operating frequency, wherein the varying of the one or more variable reactive elements commences at the default reactance value.

* * * * *